(12) United States Patent
Artmann et al.

(10) Patent No.: US 6,506,621 B1
(45) Date of Patent: Jan. 14, 2003

(54) METHOD FOR PRODUCING A DIAPHRAGM SENSOR ARRAY AND DIAPHRAGM SENSOR ARRAY

(75) Inventors: Hans Artmann, Magstadt (DE); Thorsten Pannek, Stuttgart (DE); Robert Siegel, Reute (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/016,026

(22) Filed: Dec. 12, 2001

(51) Int. Cl.$^7$ ................................. H01L 21/00
(52) U.S. Cl. ........................... 438/53; 257/419
(58) Field of Search ................ 438/53, 50–52, 438/800; 257/419, 415–418, 708

(56) References Cited

U.S. PATENT DOCUMENTS 6,204,086 B1 * 3/2001 Muchow et al. ............ 438/53

* cited by examiner

Primary Examiner—Chandra Chaudhari
Assistant Examiner—Craig Thompson
(74) Attorney, Agent, or Firm—Kenyon & Kenyon

(57) ABSTRACT

In a method for producing a diaphragm sensor array having a semiconductor material substrate on which a plurality of planar diaphragm regions is arranged as a carrier layer for sensor elements, the planar diaphragm regions are thermally decoupled from one another by crosspieces made of a material having clearly better heat conductive properties compared to the diaphragm regions and the lateral surroundings of the crosspieces. Masking for a subsequent step for producing porous semiconductor material is applied at the locations of the semiconductor material substrate at which the crosspieces for the thermal decoupling are formed, and the semiconductor regions not protected by the masking are rendered porous and the diaphragm regions are produced thereupon. Instead of using porous silicon, a plasma etching process may be performed from the backside of a semiconductor material substrate. In particular, high integration densities of diaphragm sensors may be achieved with both methods. A diaphragm sensor array is produced by one of the methods.

12 Claims, 3 Drawing Sheets

METHOD FOR PRODUCING A DIAPHRAGM SENSOR ARRAY AND DIAPHRAGM SENSOR ARRAY

FIELD OF THE INVENTION

The present invention relates to a method for producing a diaphragm sensor array and to a diaphragm sensor array.

BACKGROUND INFORMATION

Methods for producing diaphragm sensors having a semiconductor material substrate, on which at least one planar diaphragm region is arranged as a carrier layer for sensor layers are conventional. If the diaphragm sensor array includes several planar diaphragm areas, these are thermally decoupled at regular intervals from one another by crosspieces made of a material having clearly better heat conductive properties compared to the diaphragm and the lateral surroundings of the crosspieces.

Conventional diaphragm sensors are generally fashioned as thin film diaphragms. For this purpose, layer systems in thicknesses between a few 10 nm and a few micrometers are deposited on a carrier substrate and after that, the carrier substrate is removed in predefined areas, so as to obtain self-supporting diaphragm areas. Then, for example, sensor elements are applied in the center of the diaphragm, which are thermally decoupled from the surrounding carrier substrate by the self-supporting arrangement of the diaphragm, which is desirable for temperature and flow sensors.

For the purpose of exposing the diaphragm there are two different methods:
1. Surface micromechanics (SMM), in which, in general, a sacrificial layer is used which is deposited on the component side of a carrier substrate before the separation of the diaphragm. The sacrificial layer is later removed from the component side of the sensor through "detachment openings" in the diaphragm, whereby a self-supporting structure is created. These surface micromechanical methods are comparatively costly, due to the necessity for separate sacrificial layers.
2. Bulk micromechanics, in which the diaphragm is exposed from the backside of the carrier substrate by an etching step, i.e., by etching an opening through the entire thickness of the wafer, for example.

For many applications, arrays (groupings) of sensors are required. For this purpose, several like sensors are arranged side-by-side in linear or two-dimensional fashion. Where thermosensors are involved, they have to be separated from one another by heat sinks so as to make possible spatial resolution of the measuring signal.

There are a number of possibilities for producing heat sinks. Frequently, this involves depositing a layer of a good heat conductive material on the surface of the diaphragm, and structuring it so that the remaining structures of the good heat conductive material act as heat sinks.

However, one can also expose the diaphragm by bulk micromechanical processes so that crosspieces of the bulk material remain between the individual diaphragm areas. In the case of bulk micromechanical diaphragm sensors, the diaphragm is usually exposed from the backside by an anisotropic etching process, for example, using KOH (potassium hydroxide). However, despite its anisotropic properties, the etching requires considerably more space on the backside of the substrate than would be necessary for the actual diaphragm structure. Therefore, this process limits the integration density.

SUMMARY

It is an object of the present invention to lower the production costs of diaphragm sensor arrays, and particularly to make available diaphragm sensor arrays having improved integration density, which likewise makes possible a reduction in production costs.

The above and other beneficial objects of the present invention are achieved by providing a method and a diaphragm sensor array as described herein.

The present invention relates to a method for producing a diaphragm sensor array having a semiconductor material substrate on which several planar diaphragm regions are arranged as a carrier layer for sensor elements, and the planar diaphragm regions are thermally decoupled from one another by crosspieces made of a material having clearly better heat conductive properties compared to the diaphragm regions and the lateral surroundings of the crosspieces. In the sense of the present invention, the term diaphragm refers not only to a self-supporting layer, but also to a layer positioned above a volume region which has lower heat conducting characteristics than the crosspieces. The semiconductor material substrate receives a masking for a subsequent step for the generation of porous semiconductor material in locations at which the crosspieces for thermal decoupling are formed, the semiconductor material not protected by masking is rendered porous, and the diaphragm regions are subsequently generated, for example, by depositing a continuous diaphragm layer onto the semiconductor material substrate or rather the locations rendered porous. Through this method, it becomes possible to achieve high integration densities of diaphragm sensor arrays, the individual sensors of which are sufficiently decoupled thermally from one another. In this connection, porous semiconductor material may be produced by suitable masking, by way of comparison, using fine structure technique. In that manner, correspondingly delicate crosspieces may be produced, which may accordingly be arranged closely side by side, which permits a high density of sensors in an array. The thermal decoupling is maintained due to the remaining semiconductor crosspieces having a clearly greater heat conductivity, as compared to porous semiconductor material or even, as described below, after removal of semiconductor material rendered porous, as compared to the hollow space then created, filled with gas, if indicated.

A layer that is stable, during the generation of semiconductor material rendered porous, such as silicon oxide, silicon nitrite or silicon carbide, or combinations thereof, may be used for masking. This represents a comparatively simple possibility of masking, in which, additionally, heat sinks in the form of the crosspieces without projecting regions may be produced after removal of the masking layer, based on an undermining process. Although it is true that, using this method, it is not possible to form self-supporting crosspieces, i.e., the crosspieces always remain connected to the bulk material of the semiconductor material substrate.

In order to be able to produce heat sinks in the form of self-supporting crosspieces having a specified width and height, the semiconductor material substrate may receive suitable doping of specified depth as masking at locations at which the crosspieces for the thermal decoupling are developed, and that the semiconductor material not distinguished by doping may be rendered porous in the region around the crosspieces.

The semiconductor regions that have been rendered porous may be removed by etching after application of the diaphragm regions. In this manner, particularly self-supporting crosspiece structures are formed if the semiconductor region around the crosspieces were rendered porous in a continuous well. The self-supporting crosspieces are sufficient for making available heat sinks which are enough for a desired thermal decoupling. In this connection, the method has the advantage that neither additional sacrificial layers nor further layers, such as metallic ones, are required for forming the heat sinks. Rather, the "substructure" of the diaphragm sensor array below the diaphragm region, e.g., in the form of a continuous diaphragm layer, may be completely formed of semiconductor material of the substrate.

In a conventional method for the production of porous silicon, an electrochemical reaction between hydrofluoric acid and silicon is used, during which a sponge-like structure is formed in the silicon. For this, the silicon semiconductor substrate (e.g., a silicon wafer) has to be polarized anodically with respect to hydrofluoric acid electrolyte. By electrochemical etching of the silicon (anodizing) in, for example, a mixture of hydrofluoric acid and ethanol, porous silicon is generated by partial etching proceeding more deeply. For the etching of silicon, defect electrons (holes) are necessary at the interface between the silicon and the electrolyte, which are made available by the flowing current.

If the current density is less than a critical current density $j_{KRIT}$ holes diffuse to recesses arranged in the surface, because of the applied electrical field, and there an etching occurs. In the case of, for example, p-doped silicon, the regions between the recesses are etched laterally up to a minimum thickness, until no more holes may penetrate into these regions because of quantum effects, and the etching process is stopped. In this manner, a sponge-like skeleton structure is created, made of silicon and etched-free pores. During the formation of the skeleton structure, since the etching process occurs only in the area of the tips of the pores, the spongy structure of silicon already etched is maintained. Further, the size of the pores in the regions already etched remains nearly unchanged. The size of the pores depends on the HF concentration in the hydrofluoric acid, on the doping and on the current density, and may amount to from a few nanometers to a few 10 nm. Likewise, the porosity may be set in a range from approximately 10% to more than 90%.

Various doped substrates may be used for producing porous silicon. Normally, one would use p-doped wafers having different degrees of doping. The size of the structure within the porous silicon may be determined by the doping.

As a result of the generation of a porous structure, the silicon develops a large internal surface and thereby different chemical and physical properties (such as, etching rate, heat conductivity, heat capacity, etc.) from the surrounding bulk silicon. Thus, for example, reactivity is clearly increased, whereby selective etching of porous silicon to bulk silicon becomes possible.

Thus, the generation of the crosspieces in the silicon may be performed as follows.

In the case of silicon, p-doped and n-doped silicon demonstrate sharply different etching behaviors. The conditions under which porous silicon may be generated in p-doped silicon, are not possible, or possible only to a small extent in n-doped silicon. Therefore, as masking layer, for example, a thin layer at the surface of the p-doped substrate may be n-redoped (by ion implantation or diffusion). During electrochemical etching, porous silicon is created only in p-doped regions. The thickness of the masking layer may be changed by the process parameters (doping dosage, implantation energy, subsequent input of doping materials). Since the creation of porous silicon is an isotropic process, the mask is accordingly undermined. If the crosspiece regions distinguished by doping are completely undermined, self-supporting crosspiece structures result after removal of the porous silicon.

For etching the porous semiconductor material, in the case of silicon, there are essentially two possibilities, especially after the deposit of sensor layers: (1) using a strongly diluted potassium hydroxide solution (KOH); and (2) using hydrofluoric acid (HF). In this case, the porous silicon is submitted to an oxidation step even before the application of the diaphragm regions.

In an example embodiment of the present invention, in a method for producing a diaphragm sensor array having a semiconductor substrate on which a plurality of planar diaphragm regions are positioned as carrier layer for sensor elements, the plurality of planar diaphragm regions being thermally decoupled by crosspieces made of material having clearly better heat conductivity properties in comparison to the diaphragm regions and to the lateral surroundings of the crosspieces, a diaphragm layer may be applied to the component side of the semiconductor material, e.g., directly on the semiconductor material substrate, and the crosspieces may be created from the backside of the semiconductor material substrate by a subsequent anisotropic plasma etching step, in which at least approximately perpendicular etching edges in the semiconductor may be achieved. By this method, an improvement of integration density may be achieved to a substantial degree, particularly with regard to diaphragm sensor arrays, even though a bulk micromechanical method is used.

Furthermore, the present invention relates to a diaphragm sensor array having a substrate made of semiconductor material, on which adjacently lying planar diaphragm regions are positioned as carrier layer for sensor elements, which are thermally decoupled from one another by crosspieces made of material having clearly better heat conductivity properties compared to the diaphragm regions and to the lateral surroundings of the crosspieces, the crosspieces being formed from the semiconductor material of the substrate. In this example embodiment of the present invention, the width of the crosspieces directly at the diaphragm regions is less than 50 $\mu$m. This is based on the crosspieces being configured to adequately fulfill the function of a heat sink, for example, if the crosspieces are positioned underneath a continuous diaphragm and they divide the diaphragm into diaphragm regions.

In order to obtain a simple construction of a diaphragm sensor array, the crosspieces may be formed exclusively of the semiconductor material of the substrate.

If, for example, a masking made by redoping a p-doped wafer is used for producing the crosspieces on, for example, a silicon wafer, the width and the thickness of a crosspiece may simply be set by the doping process, by which the thermal conductance may be controlled in a sensitive manner. In the same manner, thin crosspieces, as seen in the vertical direction, which suffice for the requirements of a heat sink, may be produced by such a masking process. A thickness of the crosspieces of 30 $\mu$m, but also less, may be sufficient.

The structure of the heat sinks may be made of crosspieces, e.g., webs arranged crosswise, and a frame region which is connected to the crosspieces. In order to selectively obtain this heat sink structure with respect to the surrounding semiconductor material in a process in which porous semiconductor material is being produced, the crosspieces and the frame region may be doped correspondingly.

DETAILED DESCRIPTION

Figure 1:
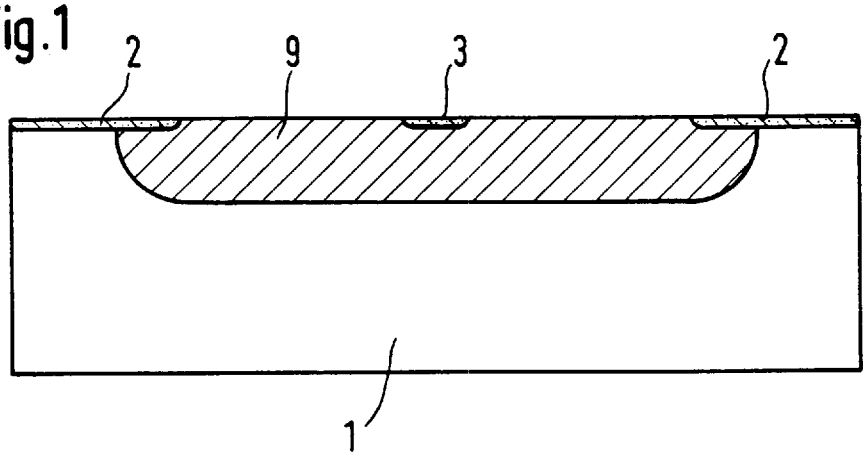
FIG. 1 is a schematic cross-sectional view of a silicon wafer having undoped regions, as masking for the production of porous silicon.
Figure 2:
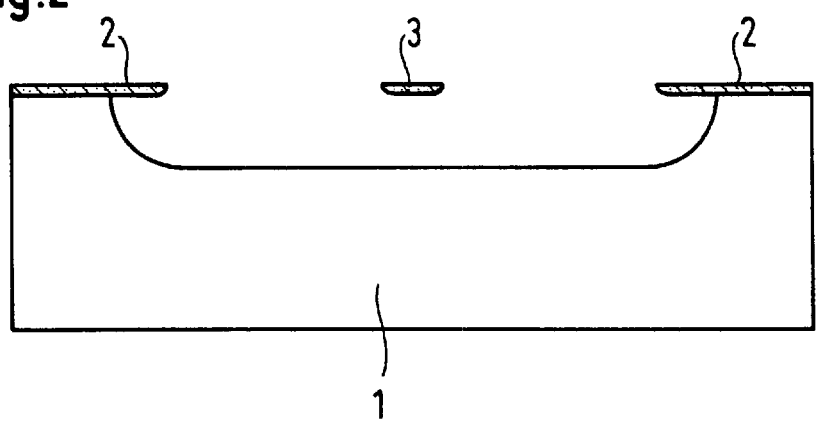
FIG. 2 is a schematic cross-sectional view of the silicon wafer illustrated in FIG. 1, having porous silicon removed by etching.

FIG. 1 illustrates a p-doped silicon wafer 1, which was "n"-redoped by an ion implantation process in the regions 2, 3. The n-doped regions are not impaired during the production of porous silicon 9. Due to the isotropic etching during the production of porous silicon, the lateral undermining under regions 2, 3 may be seen in FIG. 1. In this manner, the silicon wafer is rendered completely porous underneath region 3. After silicon 9, rendered porous, has been removed in a selective etching process as illustrated in FIG. 2, a self-supporting crosspiece made of n-doped silicon is created accordingly.

Figure 3A:
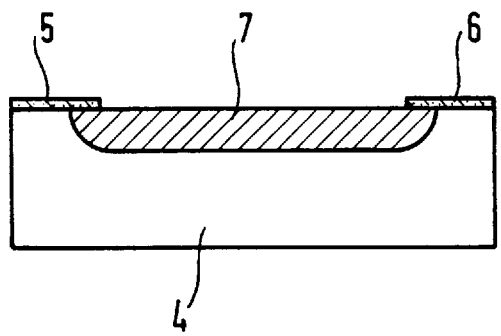
FIGS. 3a and 3b are schematic cross-sectional views of a silicon wafer, in which a subsequently removed masking layer is used for producing porous silicon.
Figure 3B:
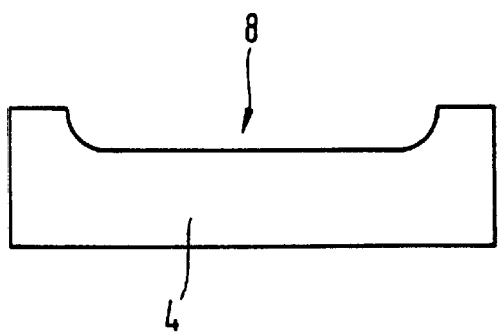

FIG. 3a illustrates a silicon wafer 4, on which, for masking a region which has been rendered porous, a mask 5, 6 made of silicon oxide and silicon nitride were produced. Before the removal of porous silicon 7, the mask of silicon oxide, silicon nitride or silicon carbide, or combinations of these, may be removed, whereby, as illustrated in FIG. 3b, a hollow 8 remains, which has at its edge regions no hanging-over "mask portions" as illustrated in FIG. 2.

Figure 5A:
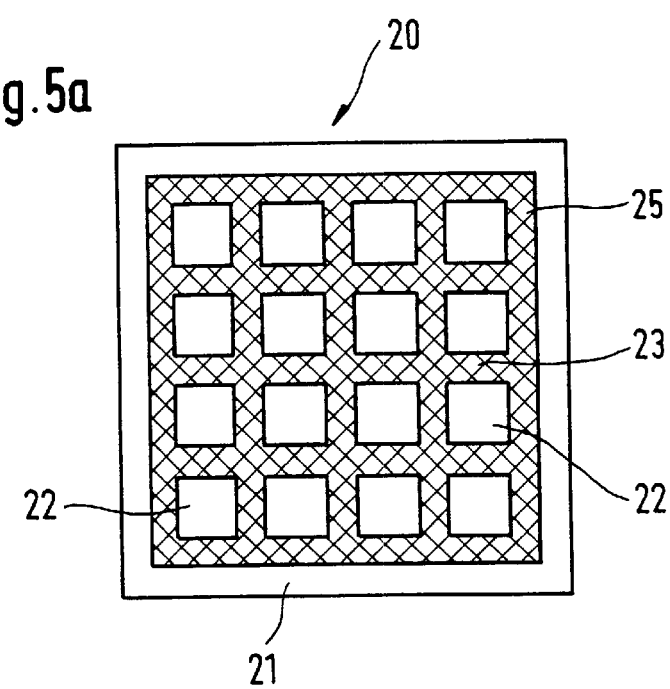
FIGS. 5a and 5b are a schematic top view and a schematic cross-sectional view, respectively, of a diaphragm sensor array.

FIG. 5a is a schematic top view of an example embodiment of a diaphragm sensor array 20. On the bulk silicon 21, self-supporting diaphragm regions 22 are formed (compare FIG. 5b) which are thermally decoupled from one another by a grid 23 having frame region 25 made of n-doped silicon, which acts as a heat sink. Grid 23 and a part of frame region 25 are self-supporting, which further improves the thermal decoupling.

Figure 5B:
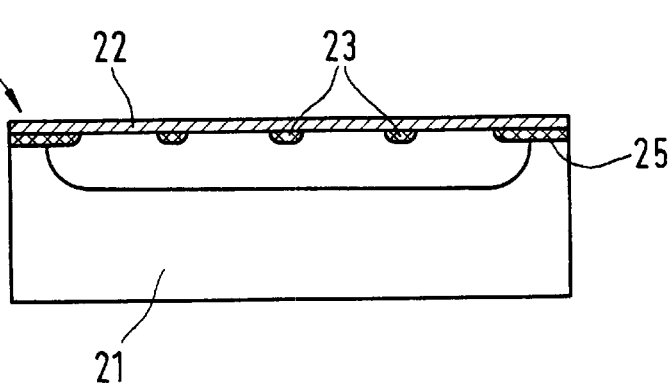

The arrangement illustrated in FIGS. 5a and 5b was formed, for example, by a surface micromechanical process, in which porous silicon was produced as an intermediate step. The grid-like, n-doped region 23 having frame region 25 was used as masking. The doping of n-doped grid 23 and of frame in, for example, p-doped bulk silicon 21 was performed by ion implantation or by a diffusion process. During ion implantation, the depth of the implanted region may be set by the implantation energy. The thickness of the heat sink, and thereby the thermal conduction resulting from it to the edge region, among other things, may thus be determined over a broad range. In a diffusion process, the doping depth may be set using the amount of doping material, the diffusion time and the diffusion temperature.

Doping depths greater than 10 $\mu$m may be achieved by diffusion, while in ion implantation the depth are in the range of 1 to 5 micrometers. A process which provides producing of porous silicon as an intermediate step, may be roughly divided up as follows:

a) production of porous silicon;

b) partial oxidation, if necessary, of the silicon rendered porous;

c) depositing of diaphragm 24 (see FIG. 5b);

d) depositing and structuring of sensor layers;

e) passivating of the diaphragm;

f) generating of openings in the diaphragm; and g) removing the porous silicon or the oxidized porous silicon.

Figure 6A:
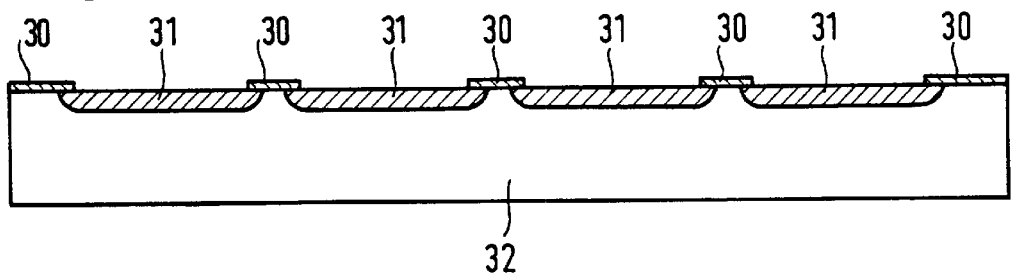
FIGS. 6a and 6b are schematic cross-sectional view of a further diaphragm sensor array in different process states.
Figure 6B:
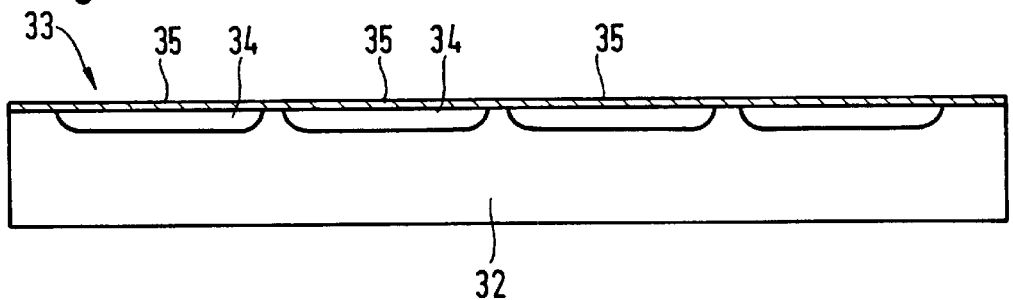

Instead of n-doped masking, a masking layer, such as a silicon oxide/silicon nitrite layer 30 (cf FIG. 6a), having a sufficient thickness may be used. During production of the porous silicon, the masking is laterally undermined, just as with an n-doped masking, due to the isotropic etching procedure. The regions rendered porous 31, which are formed in a silicon wafer 32, are illustrated in FIG. 6a as having undermining under masking 30. After local production of porous silicon, masking 30 is removed, and after possible oxidation of the porous silicon sensor diaphragm 33 is deposited (see FIG. 6b). After the production of sensor elements, the porous silicon, oxidized if necessary, is removed through corresponding openings in diaphragm 33 from the component side (of the substrate). For a more simple application, porous silicon 31 or porous silicon 31, oxidized if necessary, may also be left as is, whereby no hollows 34 are created (cf FIG. 6b). Due to its heat conductivity being reduced by approximately a factor of 100, thermal decoupling is also guaranteed when the porous silicon or the porous silicon, oxidized if necessary, is left as is. However, in view of the heat conductivity of a hollow 34 having air, a vacuum or a filling gas applied to it, the same quality is not achieved.

By using the method according to the present invention, diaphragm sensors may be formed in which the distance between the individual diaphragm regions 35 may be reduced to a minimum of approximately 20 to 50 $\mu$m.

Figure 7:
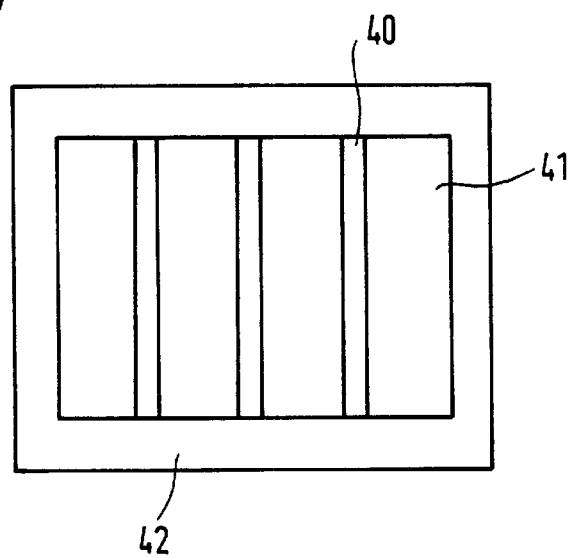
FIG. 7 is a schematic top view of a further diaphragm sensor array.

The diaphragm sensor arrays is not limited to grid structures. Other freely optional shapes of heat sinks are possible. FIG. 7, for example, illustrates an example embodiment having crosspieces 40 as heat sinks in linear form, for decoupling of self-supporting diaphragm regions 41 within a silicon bulk material 42.

Figure 4:
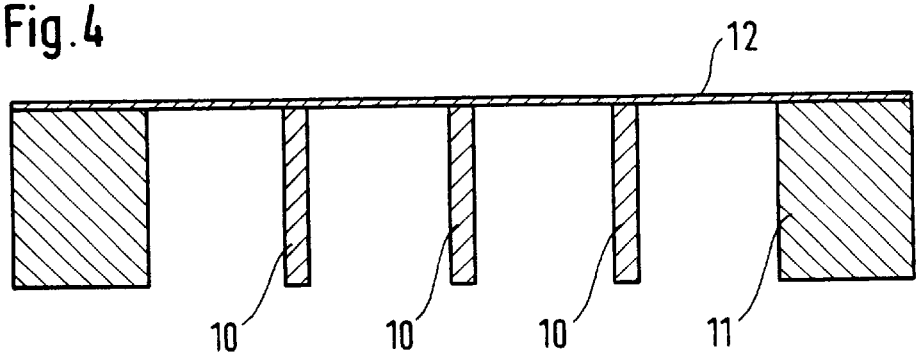
FIG. 4 is a schematic cross-sectional view of a silicon wafer after an etching process from the backside of the wafer.

In the example embodiment illustrated in FIG. 4, crosspieces 10 were produced as heat sinks, using an anisotropic plasma etching process from the backside of a silicon wafer 11. Crosspieces 10 are self-supporting. Sensor elements may be positioned on diaphragm 12 between crosspieces 10, and they are thermally decoupled from one another due to the crosspieces 10 acting as heat sinks.

What is claimed is:

1. A method for producing a diaphragm sensor array, comprising the steps of:

positioning a plurality of planar diaphragm regions on a semiconductor material substrate as a carrier layer for sensor elements;

thermally decoupling the planar diaphragm regions from one another by crosspieces made of a material having better thermal conductive properties than the diaphragm regions and lateral surroundings of the crosspieces;

applying a masking to the semiconductor material substrate at locations at which the crosspieces are formed;

rendering porous the semiconductor material not protected by the masking; and applying the diaphragm regions on the porous semiconductor material.

2. The method according to claim 1, wherein the masking includes a layer that is stable during the rendering step.

3. The method according to claim 2, wherein the layer includes at least one of silicon oxide, silicon nitride and silicon.

4. The method according to claim 1, wherein the masking applying step includes the substep of doping the semiconductor material substrate at a predefined depth at locations at which the crosspieces are formed and wherein the semiconductor material not distinguished by doping is rendered porous in the rendering step in a region of the crosspieces.

5. The method according to claim 1, further comprising the step of removing the semiconductor regions rendered porous in the rendering step by etching after the applying step.

6. The method according to claim 1, further comprising the steps of:

applying a diaphragm layer to a component side of the semiconductor material substrate; and producing the crosspieces from a backside of the semiconductor material substrate by a subsequent anisotropic plasma etching, at least approximately perpendicular etching edges being formed in the semiconductor material.

7. A diaphragm sensor array, comprising:

a substrate made of semiconductor material as a carrier layer for sensor elements;

planar diaphragm regions positioned on the substrate and arranged one next to another; and crosspieces configured to thermally decouple the sensor elements, the crosspieces made of a material having better thermal conductive properties than the diaphragm regions and lateral surroundings of the crosspieces, the crosspieces formed of the semiconductor material of the substrate, a width of the crosspieces directly at the diaphragm regions being less than 50 $\mu$m.

8. The diaphragm sensor array according to claim 7, wherein the crosspieces are formed exclusively of the semiconductor material of the substrate.

9. The diaphragm sensor array according to claim 7, wherein the crosspieces are arranged self-supportingly underneath the diaphragm regions.

10. The diaphragm sensor array according to claim 7, wherein a thickness of the crosspieces is less than 30 $\mu$m.

11. The diaphragm sensor array according to claim 7, wherein the diaphragm regions form a continuous diaphragm.

12. The diaphragm sensor array according to claim 7, wherein the crosspieces and a frame region around the crosspieces are doped.

* * * * *